(12) United States Patent
Mansour

(10) Patent No.: US 7,197,453 B2
(45) Date of Patent: Mar. 27, 2007

(54) SYSTEM AND METHOD FOR OPTIMIZING THE OPERATION OF AN OVERSAMPLED DISCRETE FOURIER TRANSFORM FILTER BANK

(75) Inventor: Mohamed F. Mansour, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 11/426,247

(22) Filed: Jun. 23, 2006

(65) Prior Publication Data

US 2007/0027679 A1    Feb. 1, 2007

Related U.S. Application Data

(60) Provisional application No. 60/703,744, filed on Jul. 29, 2005.

(51) Int. Cl.
*G06F 17/14* (2006.01)

(52) U.S. Cl. .......................................... 704/203; 703/2
(58) Field of Classification Search ..................... None
See application file for complete search history.

(56) References Cited

U.S. PATENT DOCUMENTS 6,961,685 B2 * 11/2005 Sy ................................. 703/2

* cited by examiner

*Primary Examiner*—Susan McFadden
(74) *Attorney, Agent, or Firm*—Steven A. Shaw; W. James Brady; Frederick J. Telecky, Jr.

(57) ABSTRACT

A system for, and method of optimizing an operation of an oversampled filter bank and an oversampled discrete Fourier transform (DFT) filter bank designed by the system or the method. In one embodiment, the system includes: (1) a null space generator configured to produce a basis of a null space of a perfect reconstruction condition matrix based on a first window of the oversampled filter bank and (2) an optimizer associated with the basis generator and configured to employ the null space and an optimization criterion to construct a second window of the oversampled filter bank.

20 Claims, 6 Drawing Sheets

SYSTEM AND METHOD FOR OPTIMIZING THE OPERATION OF AN OVERSAMPLED DISCRETE FOURIER TRANSFORM FILTER BANK

CROSS-REFERENCE TO RELATED APPLICATION

This application is based on and claims priority of U.S. Provisional Patent Application Ser. No. 60/703,744, filed on Jul. 29, 2005, by Mansour, entitled "Optimization Criteria in Oversampled DFT Filter Banks," commonly assigned with this application and incorporated herein by reference.

TECHNICAL FIELD OF THE INVENTION

The invention is directed, in general, to digital filters and, more particularly, to a system and method for optimizing the operation of an oversampled discrete Fourier transform (DFT) filter bank.

BACKGROUND OF THE INVENTION

Modulated filter banks have been a fundamental tool in many signal processing applications (e.g., data compression and subband adaptive filtering), mainly because they can be efficiently implemented as a polyphase digital finite impulse response (FIR) filter using the well-known discrete cosine transform (DCT) or discrete Fourier transform (DFT) for signal transformation. Modulated filter banks have been adopted in modern multimedia standards, including the Moving Picture Experts Group (MPEG) standard (see, e.g., http://www.mpeg.org), which is one of the most successful signal processing schemes in use today.

Critically sampled modulated filter banks have in general proven to be well-suited for signal compression applications in which processing of subband samples involves only quantizing coefficients, since that minimal amount of processing does not significantly increase aliasing between adjacent bands. However, for applications that require extensive subband sample processing, e.g., subband adaptive filtering (see Chapter 7 of Haykin, "Adaptive Filter Theory," 4th edition, Prentice Hall, 2002), and subband dynamic range compression (see, Brenna, et al., "A Flexible Interbank Structure for Extensive Signal Manipulations in Digital Hearing Aids," IEEE International Symposium on Circuits and Systems (ISCAS), vol. 6, pp. 569–572, 1998), oversampling is necessary to mitigate aliasing.

Modulated filter banks commonly operate with two windows: an analysis window and a synthesis window. The relative placement and shape of these windows determine the operation of the modulated filter bank. Portnoff, "Time-Frequency Representation of Digital Signal and Systems Based on Short-Time Fourier Analysis," IEEE Transactions on Acoustics, Speech, and Signal Processing, Vol. ASSP-28, No. 1, pp. 55–69, February 1980 (incorporated herein by reference), addressed the uniform DFT filter bank and described what is known in the art as "perfect reconstruction conditions" for it. (Those skilled in the art understand that "perfect" is a term of art, and does not mean absolute perfection in the colloquial sense.) Crochiere, "A Weighted Overlap-Add Method of Short-Time Fourier Transform," IEEE Transactions on Acoustics, Speech, and Signal Processing, Vol. ASSP-28, No. 1, pp. 99–102, February 1980, set forth a relatively efficient implementation of a DFT filter bank using a synthesis window overlap-add technique. Subsequent works (e.g., Shapiro, et al., "Design of Filters for the Discrete Short-Time Fourier Transform Synthesis," IEEE International Conference on Acoustics, Speech, and Signal Processing (ICASSP), 1985; Shapiro, et al., "An Algebraic Approach to Discrete Short-Time Fourier Transform Analysis and Synthesis," ICASSP, pp. 804–807, 1984; and Bolsckei, et al., "Oversampled FIR and IIR Filter Banks and Weyl-Heisenberg Frames," ICASSP, Vol. 3, pp. 1391–1394, 1996) address the design of the synthesis window. Although the problem of designing the synthesis window is relatively old, the techniques disclosed in these works were usually the "minimum-norm" solution. For example, Shapiro, et al., "Design of Filters . . . ," and Shapiro, et al., "An Algebraic Approach . . . ," both supra, proposed a minimum-norm solution for different orders of the analysis window, when the subband samples are processed, after formulating the problem as a least-square problem. In Bolsckei, et al., supra, a frame-theoretic technique was described for the design of the synthesis window using para-unitary prototypes.

Accordingly, what is needed in the art is a better technique for optimizing the operation of an oversampled DFT filter bank. What is also needed in the art is a DFT filter bank that has been optimized by the technique thereby to yield improved operation.

SUMMARY OF THE INVENTION

To address the above-discussed deficiencies of the prior art, the invention provides, in one aspect, a system for optimizing an operation of an oversampled filter bank. In one embodiment, the system includes: (1) a null space generator configured to produce a basis of a null space of a perfect reconstruction condition matrix based on a first window of the oversampled filter bank and (2) an optimizer associated with the null space generator and configured to employ the basis and an optimization criterion to construct a second window of the oversampled filter bank.

In another aspect, the present invention provides a method of optimizing an operation of an oversampled filter bank. In one embodiment, the method includes: (1) producing a basis of a null space of a perfect reconstruction condition matrix based on a first window of the oversampled filter bank and (2) employing the basis and an optimization criterion to construct a second window of the oversampled filter bank.

In yet another aspect, the present invention provides an oversampled DFT filter bank. In one embodiment, the DFT filter bank includes a plurality of lowpass filters configured to process an input signal to yield an output signal based in part on coefficients that describe a second window designed by: (1) producing a basis of a null space of a perfect reconstruction condition matrix based on a first window of the oversampled filter bank and (2) employing the basis and an optimization criterion to construct the second window.

The foregoing has outlined preferred and alternative features of the invention so that those skilled in the pertinent art may better understand the detailed description of the invention that follows. Additional features of the invention will be described hereinafter that form the subject of the claims of the invention. Those skilled in the pertinent art should appreciate that they can readily use the disclosed conception and specific embodiment as a basis for designing or modifying other structures for carrying out the same purposes of the invention. Those skilled in the pertinent art should also realize that such equivalent constructions do not depart from the spirit and scope of the invention.

BRIEF DESCRIPTION OF THE DRAWINGS

For a more complete understanding of the invention, reference is now made to the following descriptions taken in conjunction with the accompanying drawing, in which.

DETAILED DESCRIPTION

As those skilled in the pertinent art understand and as stated above, oversampled filter banks have an analysis window and a synthesis window. The analysis window is usually designed to meet one or more predefined criteria pertaining to the use to which the filter bank is to be put. The synthesis window is almost always designed based on the design of the analysis window. A novel, general formulation by which the synthesis window may be designed given an analysis window will be introduced herein. The general formulation uses the null space of a perfect reconstruction condition matrix to determine the optimal synthesis window design and contrasts sharply with conventional techniques, which are uniformly directed to the "minimum-norm" solution of the synthesis window. Different optimization criteria of the synthesis window will be disclosed, and explicit, closed-form solutions of the different optimization criteria will be set forth.

The focus herein will be on a synthesis window design technique that satisfies perfect reconstruction conditions. The algebraic approach described in Portnoff, supra, and Shapiro, et al., "Design of Filters . . . ," supra, will be used herein rather than the frame-theoretic approach, as it is more illustrative of the optimization objective functions that will be set forth below.

Oversampling yields extra degrees of freedom that can be exploited in different ways. In particular, oversampling can produce a non-zero null space of the perfect reconstruction condition matrix. This null space can be exploited to optimize the objective function of different criteria without sacrificing the perfect reconstruction. Closed-form solutions of the synthesis window design will be described for the following optimization criteria:

1. Minimum delay design. Minimum delay design produces the smallest output lag of the causal implementation of synthesis window and represents the minimum-order filter that requires the least computation resources.

2. Minimum out-of-band design. Minimum out-of-band design produces the best frequency selectivity.

3. Least-square design. Least-square design produces the closest synthesis window to a given template.

4. Minimum quantization-error design. Minimum quantization-error design minimizes the quantization error for a fixed-point implementation.

The perfect reconstruction conditions will first be reviewed. Then, a general optimization model for the synthesis window using the minimum-norm solution and the basis of the null space of the perfect reconstruction condition matrix will be described. Next, the different optimization criteria will be set forth and an example given for each of the criteria using a template low pass analysis window.

Optimization Model

Figure 1:
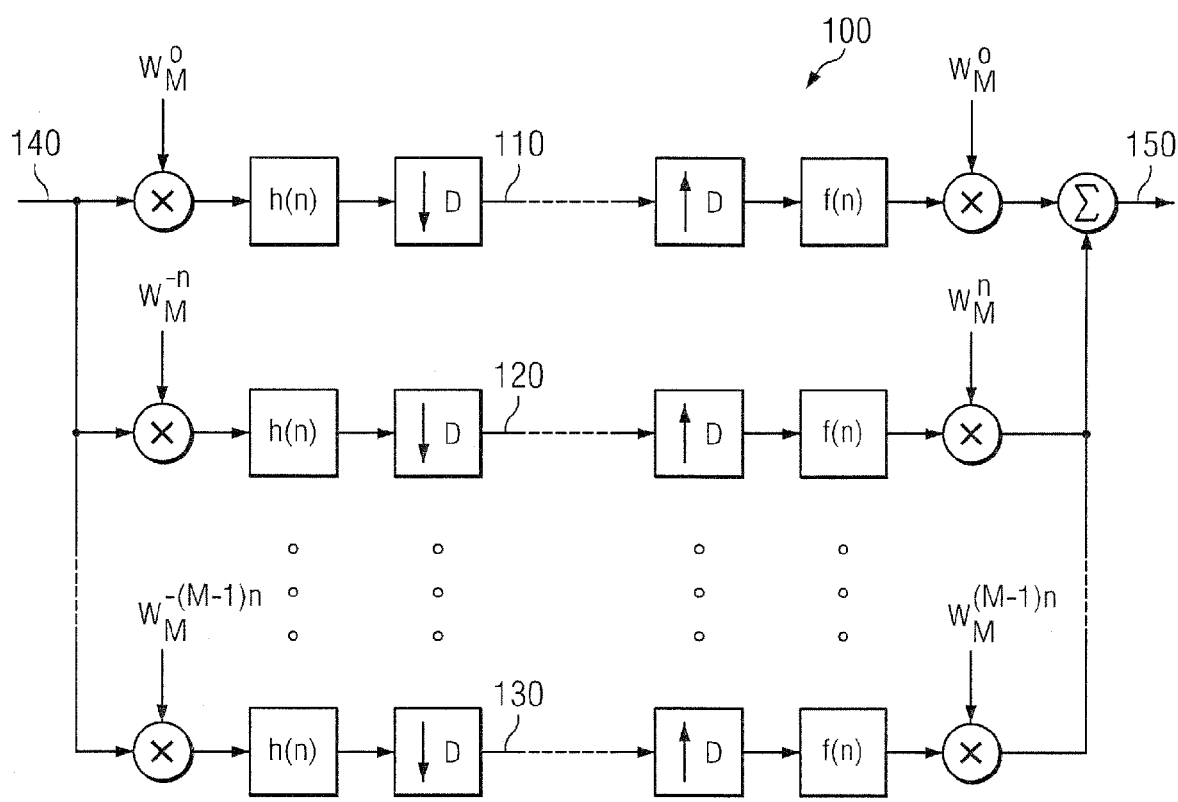
FIG. 1 illustrates a schematic diagram of an oversampled filter bank in which a downsampling factor is less than the number of bands in the filter bank and constructed according to the principles of the invention.

FIG. 1 illustrates a schematic diagram of an oversampled filter bank 100 in which a downsampling factor D is less than a number M of bands (e.g., 110, 120, 130) in the filter bank and constructed according to the principles of the invention. The filter bank 100 is a so-called "perfect reconstruction, or PR, filter bank, meaning that the filter bank 100 operates by decomposing an input signal X(z) 140 by filtering and subsampling and then reconstructing to yield an output signal $\hat{X}(z)$ 150 by inserting zeroes, filtering and summation. For a discussion of PR filter banks in general, see, e.g., http://cas.ensmp.fr/~chaplais/Wavetour_presentation/filtres/Perf ect_Reconstruction.html.

If H(z) and F(z) represent prototype analysis and synthesis filters (respectively), the $k^{th}$ band analysis and synthesis filters are:

$$H_k(z)=H(zW_M^k), \text{ and}$$

$$F_k(z)=F(zW_M^k),$$

i.e., $h_k(n)=h(n) \cdot W_M^{-kn}$ and $f_k(n)=f(n) \cdot W_M^{-kn}$, assuming that support$(h(n)) \in [-L_h, L_h]$ and support$(f(n)) \in [-L_f, L_f]$. The reconstructed signal $\hat{X}(z)$ has the form:

$$\hat{X}(z) = \frac{1}{D}\sum_{l=0}^{D-1} A_l(z) \cdot X(zW_D^l), \quad (1)$$

where $$A_l(z) = \sum_{k=0}^{M-1} H(z \cdot W_D^l \cdot W_M^k) \cdot F(z \cdot W_M^k), \quad \text{with } l = 0, 1, \ldots, D-1. \quad (2)$$

According to Portnoff, supra, the necessary and sufficient conditions for perfect reconstruction are:

1. Perfect reconstruction condition:

$$\sum_{l=-\infty}^{\infty} h(lD-n) \cdot f(n-lD) = 1/M, \quad \text{for } 0 \le n \le D-1, \text{ and} \quad (3)$$

2. Aliasing canceling condition:

$$\sum_{l=-\infty}^{\infty} h(lD - n + rM) \cdot f(n - lD) = 0, \quad \text{for } 0 \leq n \leq D-1. \quad (4)$$

In the following, different (yet equivalent) perfect reconstruction conditions will be used that are more illustrative. From Equations (1) and (2), the perfect reconstruction conditions can be derived as:

$$A_l(z) = \delta[l]$$

This condition can be expressed as:

$$\sum_{m=-L_f}^{L_f} f(m) \cdot h(-m) = \frac{D}{M}, \quad (5)$$

$$\sum_{m=-L_f}^{L_f} f(m) \cdot h(-m) = 0, \quad \text{for } 1 \leq |r| \leq \left\lfloor \frac{L_h + L_f}{M} \right\rfloor,$$

$$\sum_{m=-L_f}^{L_f} \cos\left(\frac{2\pi lm}{D}\right) \cdot f(m) \cdot h(rM - m) = 0,$$

for $1 \leq l \leq \frac{D}{2}$, and $1 \leq |r| \leq \left\lfloor \frac{L_h + L_f}{M} \right\rfloor$, and $$\sum_{m=-L_f}^{L_f} \sin\left(\frac{2\pi lm}{D}\right) \cdot f(m) \cdot h(rM - m) = 0, \quad \text{for } 1 \leq l \leq \frac{D}{2} - 1,$$

and $1 \leq |r| \leq \left\lfloor \frac{L_h + L_f}{M} \right\rfloor$, in other words:

$$\sum_{m=-L_f}^{L_f} W_D^{-lm} \cdot f(m) \cdot h(rM - m) = \frac{D}{M} \delta(l, r),$$

for $0 \leq l \leq D-1$, and $$1 \leq |r| \leq \left\lfloor \frac{L_h + L_f}{M} \right\rfloor.$$

It is straightforward to show the equivalence of the two perfect reconstruction conditions. From Equation (5), a total of $$D \cdot \left(1 + 2 \cdot \left\lfloor \frac{L_h + L_f}{M} \right\rfloor\right)$$

conditions exist. Some of the conditions (at the filter edges) may be dependent. The perfect reconstruction conditions can be put in a matrix form as:

$$H \cdot \underline{f} = \underline{z}, \quad (6)$$

where $\underline{f} = [f(-L_f), f(-L_f+1), \ldots, f(0), \ldots, f(L_f)]$ is the synthesis window, $H_{D(1+2 \cdot \lfloor (L_h+L_f)/M \rfloor) \times (2L_f+1)}$ is the conditions matrix (which is constructed from the conditions in Equation (5)), $\underline{z} = [D/M, 0, 0, \ldots, 0]$. Note that:

$$\text{rank}(H) \leq D \cdot \left(1 + 2 \left\lfloor \frac{L_h + L_f}{M} \right\rfloor\right). \quad (7)$$

The minimum-norm solution $\underline{f}^\#$ is calculated as:

$$\underline{f}^\# = H^\# \cdot \underline{z}, \quad (8)$$

where $H^\#$ is the pseudo-inverse of the condition matrix H (see, e.g., Chapter 5 of Golub, et al., *Matrix Computation*, 3rd edition, The John Hopkins University Press, 1996). The dimension of the null space of H is:

$$K = 2L_f + 1 - \text{rank}(H).$$

If the basis of the null space is $\{\underline{v}_i\}_{i=1:K}$, a general formula for a synthesis window $\underline{f}$ that satisfies the perfect reconstruction conditions is:

$$\underline{f} = \underline{f}^\# + \sum_{i=1}^{K} c_i \cdot \underline{v}_i, \quad (9)$$

where $\{c_i\}_{i=1:K}$ are scalars. Equation (9) represents the general model for optimization that will be used below.

No vectors in the null space of H interfere with the perfect reconstruction conditions set forth in Equation (5). Therefore, any vector v in the null space satisfies the following condition:

$$\sum_{m=-L_f}^{L_f} W_D^{-lm} \cdot v(m) \cdot h(rM - m) = 0, \quad (10)$$

for $0 \leq l \leq D-1$, and $0 \leq |r| \leq \left\lfloor \frac{L_h + L_f}{M} \right\rfloor$.

No structure for $\underline{h}$ is assumed in the above discussion. In fact, even if $\underline{h}$ is an arbitrary vector, the above perfect reconstruction formula still applies. However, in most practical applications, $\underline{h}$ is a lowpass filter having a bandwidth of $2\pi/M$.

Note that in the perfect reconstruction conditions set forth in Equation (5), $\underline{h}$ and $\underline{f}$ may be exchanged without affecting the perfect reconstruction, i.e., the synthesis window may be designed first and then the analysis window chosen that satisfies the perfect reconstruction condition using substantially the same procedure.

Optimization Criteria

Various optimization criteria for constructing a synthesis window $\underline{f}$ that satisfies Equation (9) will now be described. With each criterion, the objective is to find $\{c_i\}_{i=1:K}$ in Equation (9) that optimize a certain objective function. This optimization is possible whenever a nonzero null space of the condition matrix H exists. Redundancy may be exploited by reducing the order of the synthesis window as described below rather than optimizing its design. The optimization examples described herein may be extended to other filter design optimizations using the model described in Equation (9).

Figure 2:
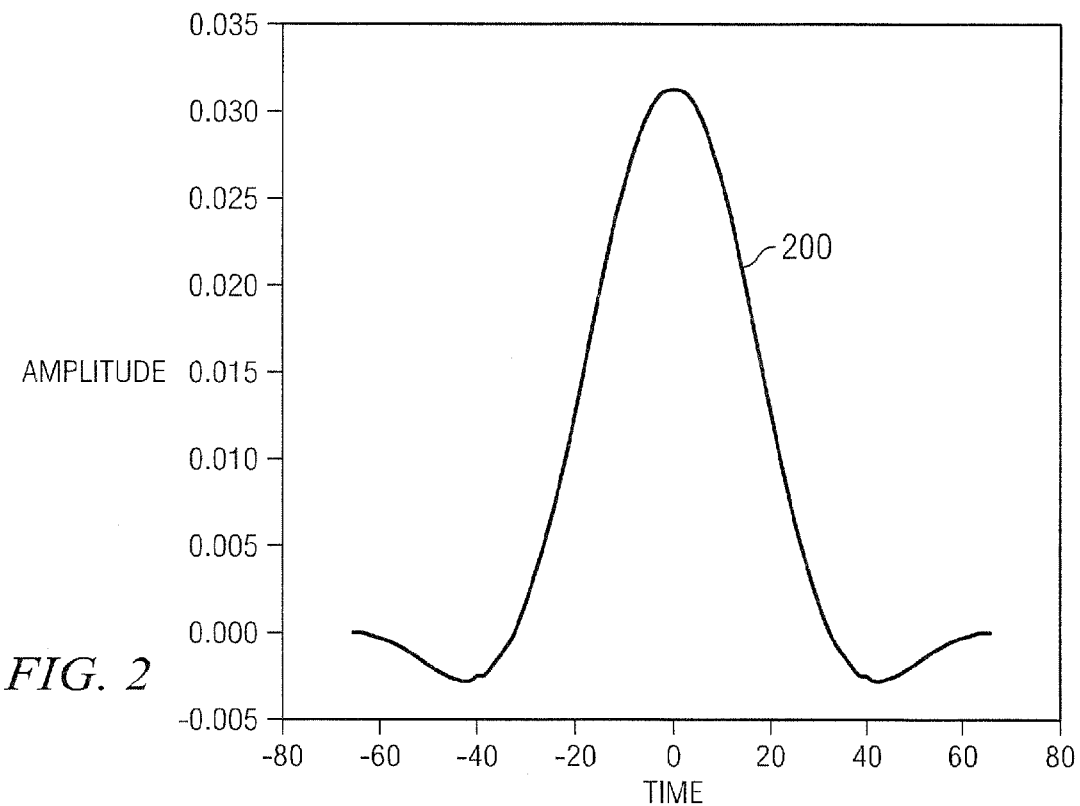
FIG. 2 illustrates a graph of a zero-phase low pass filter having a cutoff frequency of $2\pi/M$ designed using windowing with a Kaiser window.

To illustrate the different optimization criteria better, a design example will be included with each criterion. In all the examples, the following filter bank parameter settings will be used: M=32, D=8 and $L_h$=64. The analysis window is as shown in FIG. 2, namely a zero-phase low pass filter curve 200 having a cutoff frequency of $2\pi/M$ that is designed using windowing with a Kaiser window.

Least-Order Solution

The smallest order of the synthesis window is directly related to the rank of the condition matrix H. If the synthesis window order equals rank(H), H is a full rank square matrix and we have only one solution, i.e., the redundancy is exploited by reducing the order of the window rather than optimizing the design as in Equation (9). Therefore the least order of the synthesis window satisfies the condition:

$$2\hat{L}_f + 1 = \text{rank}(H) \leq D \cdot \left(1 + 2\left\lfloor \frac{L_h + \hat{L}_f}{M} \right\rfloor\right). \quad (11)$$

$\hat{L}_f$ is evaluated and approximated to the nearest upper integer (which may result in increasing the dimension of the null space of H to one). After approximation, rank(k)=$2\hat{L}_f$+1, $H^\#=H^{-1}$, and the null space of H contains only the zero vector. Longer synthesis window results in larger null space dimensions, which allows more degrees of freedom. All subsequent optimization criteria assume that the synthesis window order is larger than $\hat{L}_f$.

Figure 3:
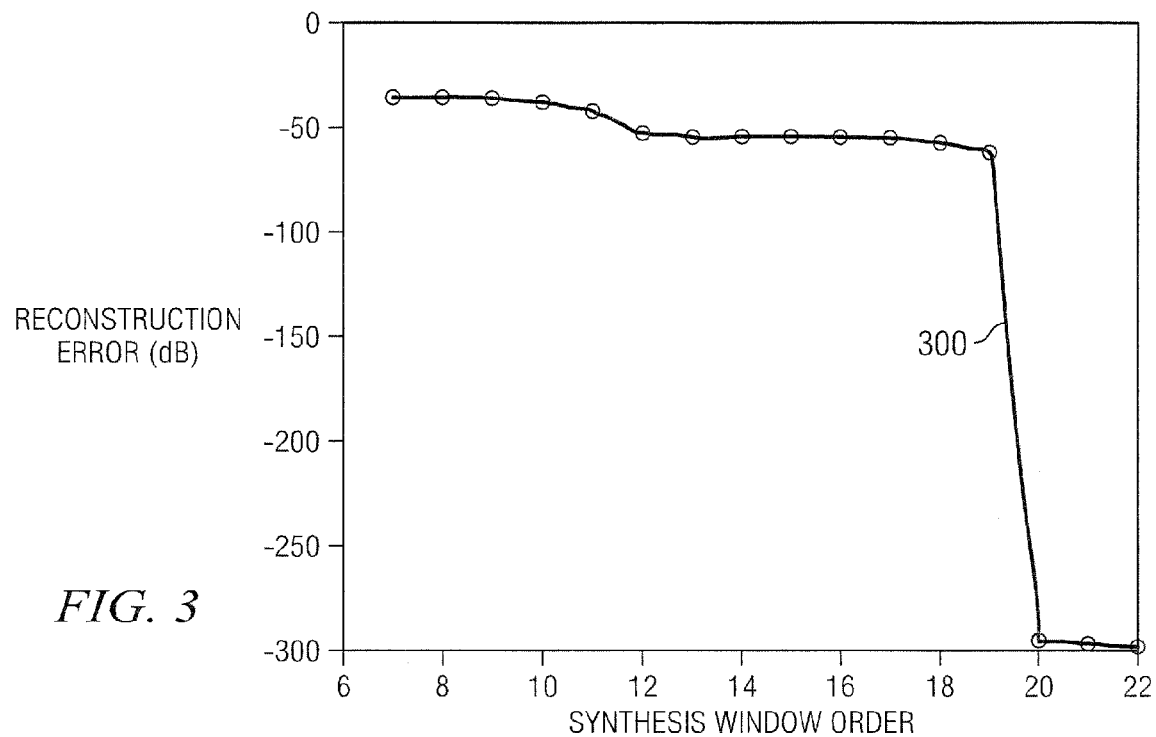
FIG. 3 illustrates a graph of reconstruction mean-square error for different orders of the synthesis window for the analysis window of FIG. 2.

If the order is less than $\hat{L}_f$, perfect reconstruction is no longer possible. However, the least-square solution of Equation (6) yields the best possible reconstruction for a given order. FIG. 3 shows a reconstruction mean-square error curve 300 for different orders of the synthesis window for the analysis window of FIG. 2 where $\hat{L}_f$=20.

For the minimum-order synthesis window, $$\text{rank}(H) \leq D \cdot \left(1 + 2\left\lfloor \frac{L_h + L_f}{M} \right\rfloor\right) = 40.$$

Figure 4:
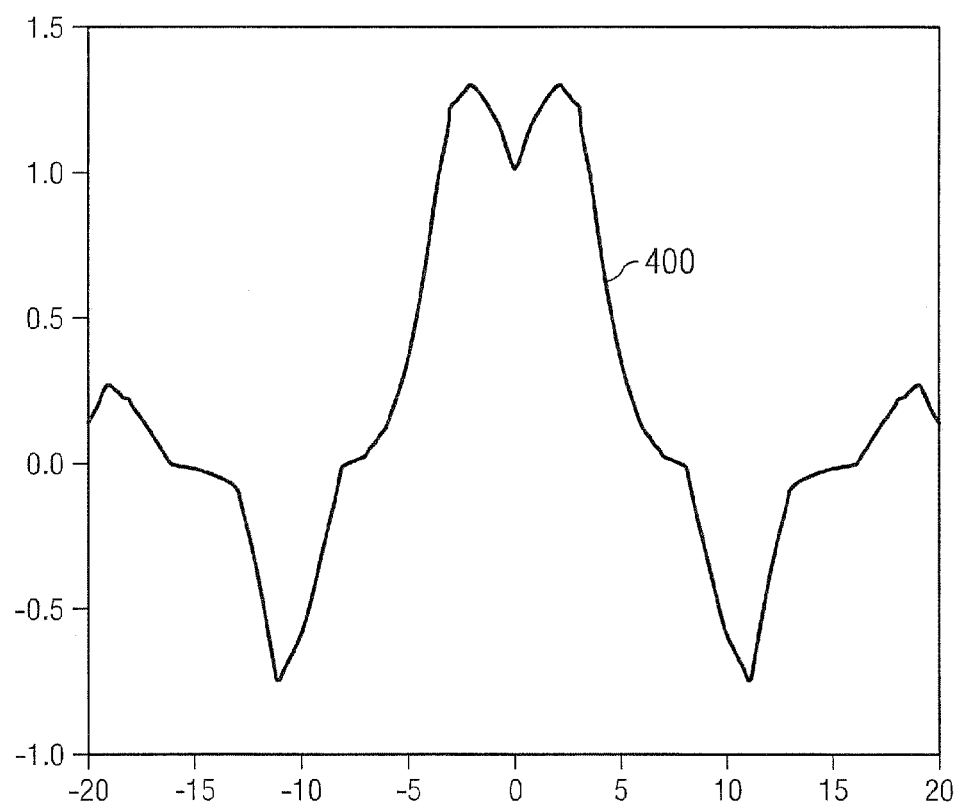
FIG. 4 illustrates a graph of a minimum-order synthesis window.

FIG. 4 shows a synthesis window 400. In this case, the dimension of the null space is one (because of the upper integer approximation).

For causal systems, the least order solution is equivalent to the minimum delay solution, a desirable feature in many real-time applications, e.g., subband adaptive filtering.

Minimum-Norm Solution

Note that $\{\underline{v}_i\}_{i=1:M}$ in Equation (9) are orthogonal to the columns of $H^\#$. As a result:

$$\|\underline{f}\| = \|\underline{f}^\#\|^2 + \sum_{i=1}^{K} c_i^2.$$

Therefore, the minimum-norm solution is $\underline{f}=\underline{f}^\#$.

C. Minimum Out-of-Band Energy Solution

If a lowpass filter prototype is used, the bandwidth of the analysis/synthesis window is $2\pi/M$. If the DFT of $\underline{f}$ is denoted by $f(e^{j\omega})$, the objective function becomes:

$$\min \int_{2\pi/M}^{\pi} \|F(e^{j\omega})\|^2 \cdot d\omega. \quad (12)$$

If the DFT of each of the base vectors $\underline{v}_i$ is $\underline{V}_i$, then Equation (9) yields the following:

$$\underline{F} = \underline{F}^\# + \sum_{i=1}^{K} c_i \cdot \underline{V}_i.$$

Assuming the length of the DFT is N, only the first N/2+1 components are retained (because of the real symmetry), i.e., $\underline{F}, \underline{F}^\#$, and $\{\underline{V}_i\}$ are arrays of size N/2+1.

If A is a diagonal matrix of size (N/2+1)×(N/2+1) such that $a_{i,i}$=0 for $$i < \frac{N}{M}$$

and $a_{i,i}$=1 other wise $V_{(N/2+1)\times K}$ is a matrix that has $\{\underline{V}_i\}$ as its columns and $\underline{c}=[c_1, \ldots, c_M]^T$, the objective function can be approximated as:

$$J(\underline{c})=\underline{F}^H \cdot A \cdot \underline{F}=(\underline{F}^\#+V_{\underline{c}})^H A \cdot (\underline{F}^\#+V_{\underline{c}}),\text{ and}$$

$$=\underline{F}^{\#H} \cdot A \cdot \underline{F}^\# + \underline{b}^H \cdot \underline{c} + \underline{c}^H \cdot \underline{b} + \underline{c}^H \cdot G \cdot \underline{c}.$$

where $\underline{b}=V^H A \underline{F}^\#$ and $G=V^H AV$. Differentiating with respect to $\underline{c}$ yields:

$$\frac{\partial J}{\partial c^*} = b + G \cdot \underline{c}.$$

Therefore the optimal solution in this case is:

$$\underline{\hat{c}}=-(V^H AV)^{-1} \cdot V^H A \underline{F}^\#. \quad (13)$$

Note that $V^H$ AV is K×K matrix, and a necessary condition for $V^H$ AV to have full rank is $$\frac{N}{2} + 1 - \frac{N}{M} > K.$$

Figure 5A:
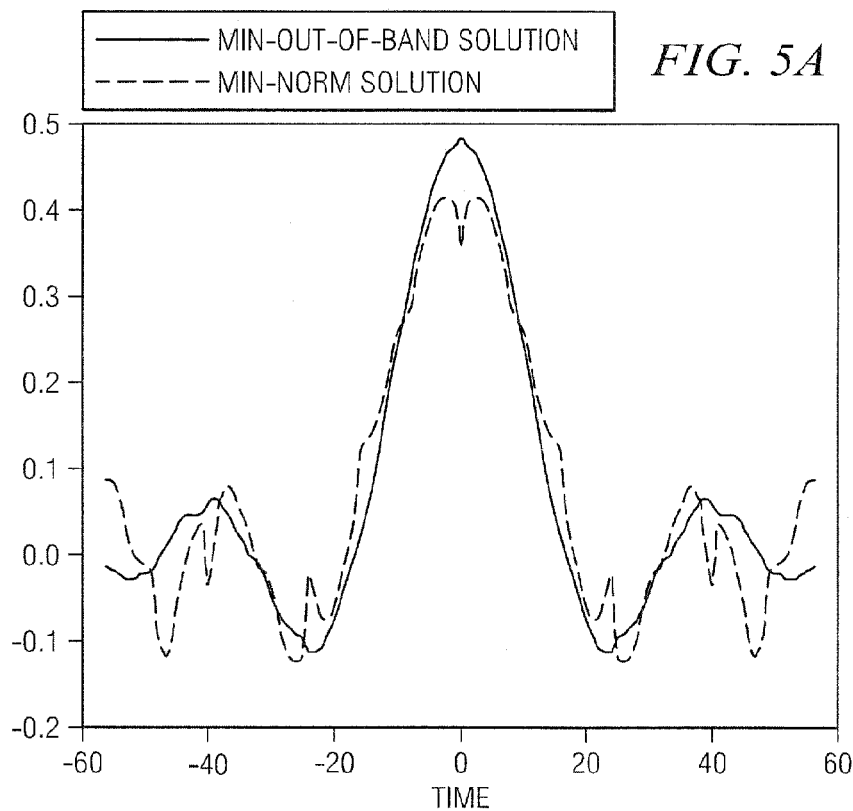
FIGS. 5A and 5B respectively illustrate time and frequency responses of a synthesis window and a minimum-norm synthesis window for $L_f=56$.
Figure 5B:
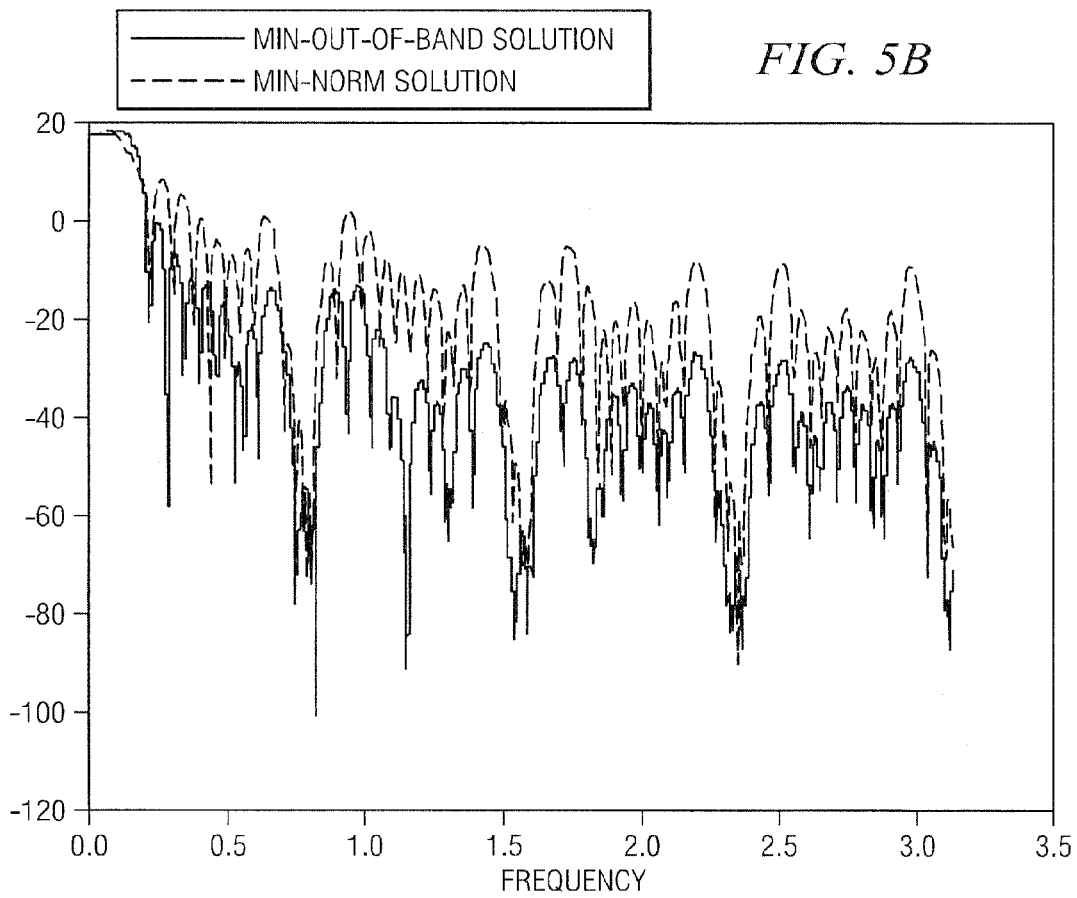
Figure 6A:
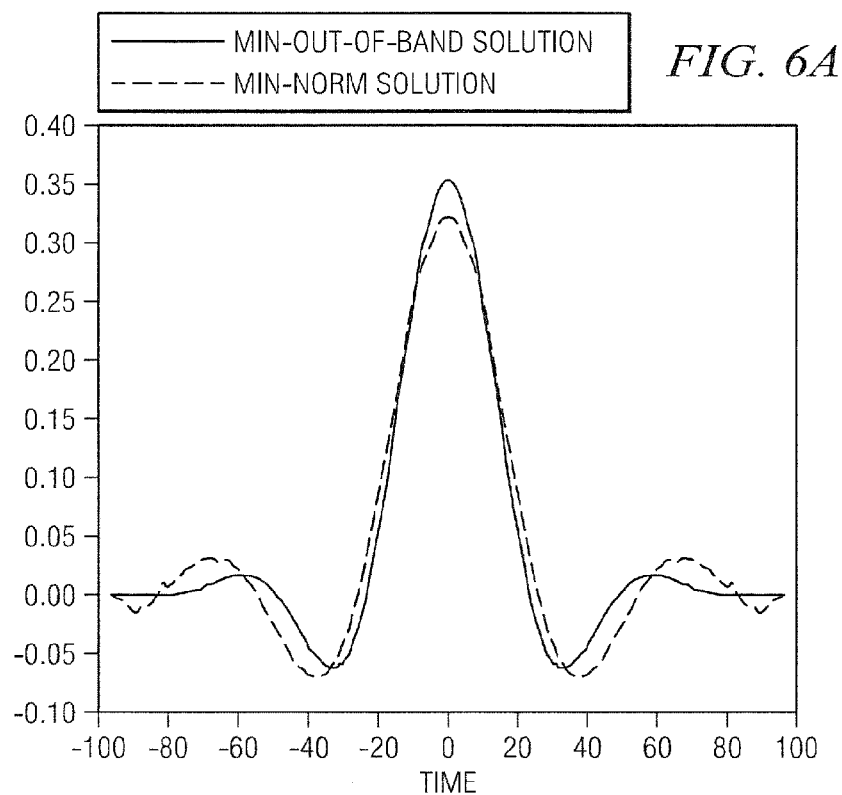
FIGS. 6A and 6B respectively illustrate time and frequency responses of a synthesis window and a minimum-norm synthesis window for $L_f=96$.
Figure 6B:
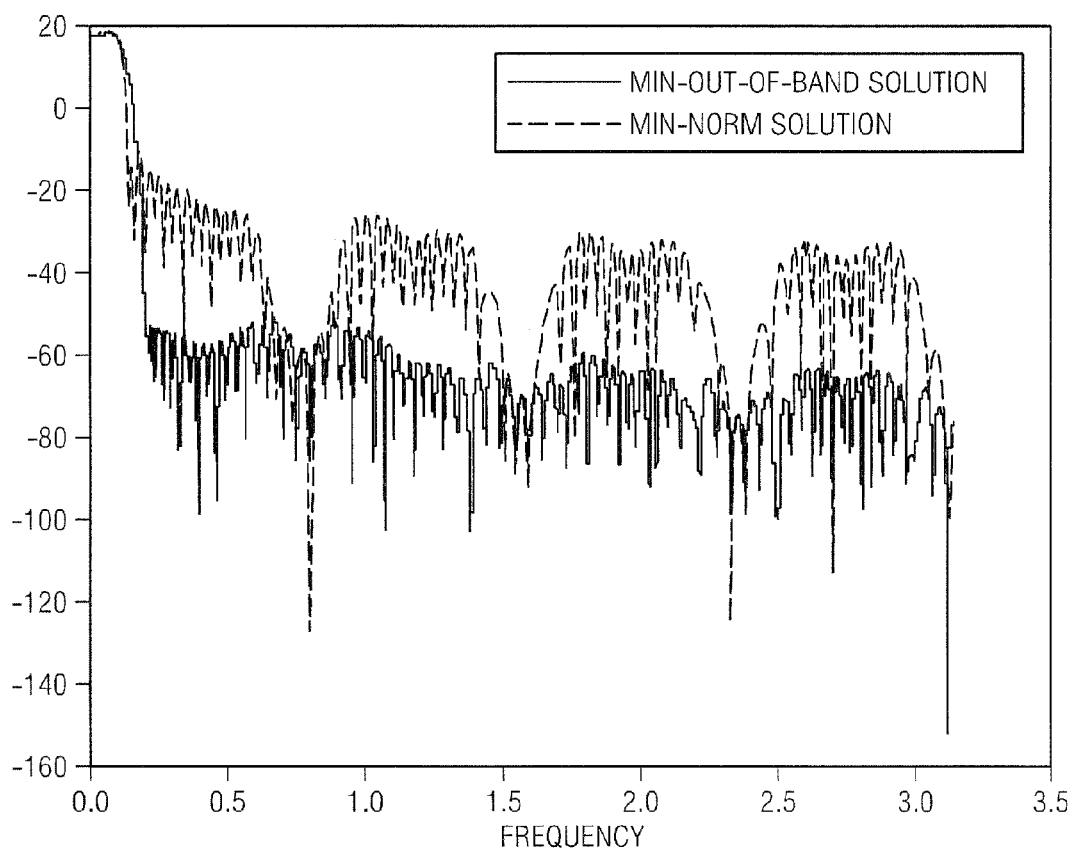

The minimum out-of-band power design will be illustrated by two examples with $L_f$=56 and $L_f$=96, respectively. FIGS. 5A and 5B show the time and frequency responses of the synthesis windows compared with the minimum-norm synthesis window for $L_f$=56, and FIGS. 6A and 6B show the time and frequency responses of the synthesis windows compared with the minimum-norm synthesis window for $L_f$=96. FIGS. 5A, 5B, 6A and 6B show a reduction of more than 30 dB in the out-of-band power. This significant reduction results in a better frequency-selective window, a desirable feature in practical applications in which the original signal is usually contaminated with noise.

Least-Square Solution

In this case, the objective is to minimize the difference between the synthesis window and a window template $\underline{g}$, i.e., the objective function is:

$$\min\|\underline{f}-\underline{g}\|^2. \quad (14)$$

If:

$$\Lambda_{(2L+1)\times K}=(\underline{v}_1,\underline{v}_2,\ldots,\underline{v}_K), \quad (15)$$

the cost function has the form:

$$J(\underline{c})=(\underline{f}^\#+\Lambda\underline{c}-\underline{g})^H \cdot (\underline{f}^\#+\Lambda\underline{c}-\underline{g}).$$

Therefore:

$$\frac{\partial J}{\partial c^*} = \Lambda^H(\underline{f}^\# - \underline{g}) + \Lambda^H \Lambda \underline{c}.$$

Hence, the optimal solution in this case is:

$$\underline{\hat{c}} = -(\Lambda^H \Lambda)^{-1} \cdot \Lambda^H (\underline{f}^\# - \underline{g}).$$

By noting that $\Lambda^H \Lambda = I$ and $\Lambda^H \cdot \underline{f}^\# = 0$ (because $\underline{f}^\#$ is in the row space of H), the above relation can be simplified to:

$$\underline{\hat{c}} = -\Lambda^H \cdot \underline{g}. \qquad (16)$$

Figure 7A:
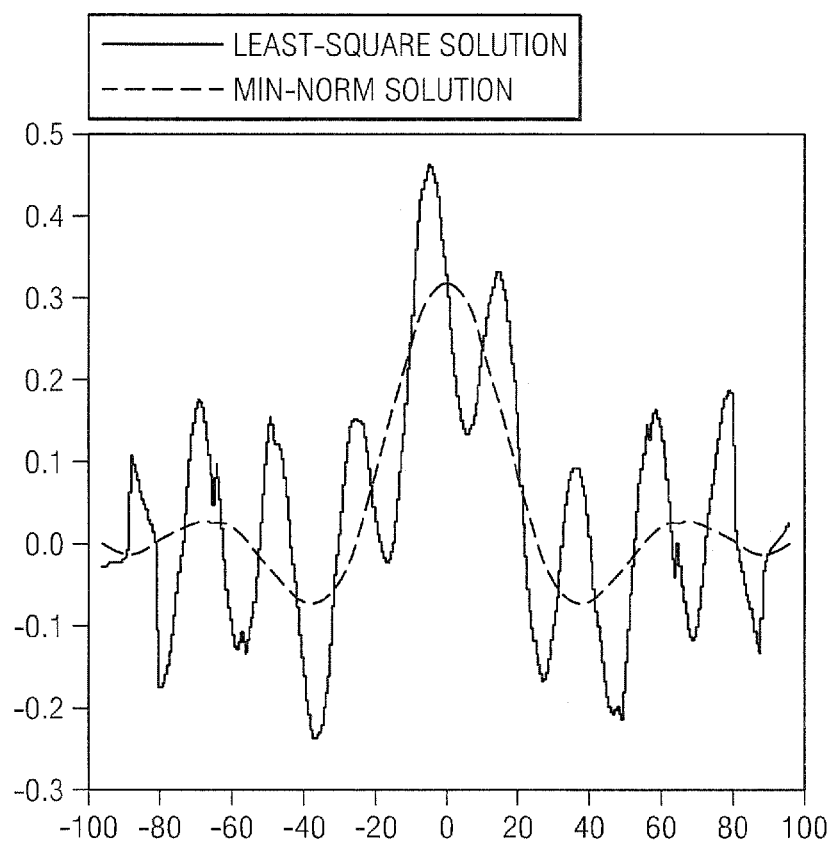
FIGS. 7A and 7B respectively illustrate least-square synthesis windows corresponding to sinusoid and white noise templates.
Figure 7B:
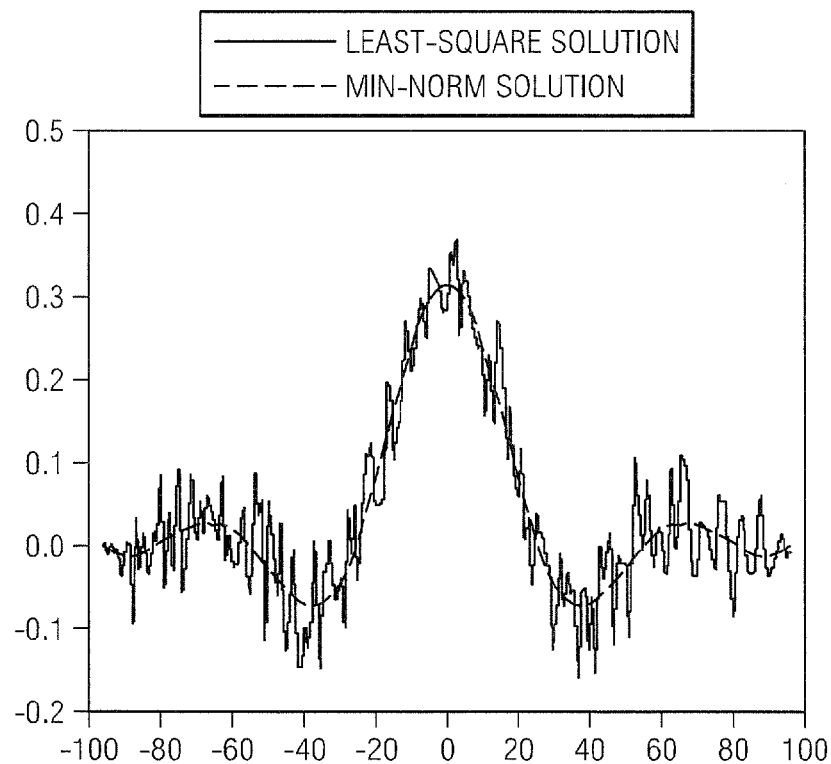

To illustrate the significance of the least-square solution, the template $\underline{g}$ is chosen to be significantly different from $\underline{f}^\#$ in two extreme examples. In the first example, $\underline{g}$ is chosen to be a sine wave. In the second example, $\underline{g}$ is chosen to be an arbitrary sequence. The resulting synthesis windows are illustrated in FIGS. 7A and 7B. In both examples, $L_f=96$.

Minimum Quantization-Error Solution

In practical applications, the synthesis window will be implemented using finite-precision arithmetic. Therefore, coefficients quantization error is an important design criterion. The best quantization of each component in $\underline{f}$ (to the upper or lower integer) such that the overall quantization error is minimized will now be considered. In other words, the best quantized solution in the neighborhood of an existing solution $\underline{f}$ will be examined. The objective function in this case is:

$$\min \|Q(\underline{f})\|^2, \qquad (17)$$

where $Q(\cdot)$ is the quantization error function defined as:

$$Q(\underline{f}) = \underline{f} + \Lambda \cdot \underline{c} - (\lfloor \underline{f} \rfloor + \underline{\alpha}), \qquad (18)$$

and where $\lfloor \cdot \rfloor$ is the floor integer function, $\Lambda$ is as defined in Equation (15), $\underline{\alpha}$ is an $(2L_f-1)$ binary vector that represents the quantization approximation, i.e., if $Q(f_i)=\lfloor f_i \rfloor$, then $\alpha_i=0$, and if $Q(f_i)=\lceil f_i \rceil$, then $\alpha_i=1$. Note that Equation (18) contains two unknown vectors, $\underline{c}$ and $\underline{\alpha}$. If $\underline{e}$ denotes the initial quantization error, then:

$$\underline{e} = \underline{f} - \lfloor \underline{f} \rfloor.$$

The objective function can be written in the form:

$$\min \|\Lambda \cdot \underline{c} + (\underline{e} - \underline{\alpha})\|^2. \qquad (19)$$

For any value of $\underline{\alpha}$, the value of $\underline{c}$ that yields the least square solution of Equation (19) is:

$$\underline{\hat{c}} = -\Lambda^H \cdot (\underline{e} - \underline{\alpha}).$$

For this reason, the objective function of Equation (19) can be written in the form:

$$(\underline{e} - \underline{\alpha})^H \cdot P \cdot (\underline{e} - \underline{\alpha}), \qquad (20)$$

where $P = (I - \Lambda \Lambda^H)^H (I - \Lambda \Lambda^H)$. This is an integer programming problem with a quadratic objective function. A simulated annealing technique (see, e.g., Chapter 12 of Rardin, *Optimization in Operations Research*, Prentice Hall, 1998, incorporated herein by reference) may be used to solve it. The simulated annealing technique Rardin discloses has the following seven steps:

1. Starting with a feasible solution $\underline{\alpha}^{(0)}$, compute the corresponding value of the objective function. Set this value as the incumbent solution $\underline{\hat{\alpha}}$ and the pivot solution $\underline{\tilde{\alpha}}$.

2. Define a set $\Omega$, of all feasible moves that lead to another feasible solution.

3. Arbitrarily choose a move $\Delta \underline{\alpha}^{(t)} \in \Omega$, and compute the new solution $\underline{\alpha}^{(t)} = \underline{\tilde{\alpha}} + \Delta \underline{\alpha}^{(t)}$, and compute the new objective function $\mathrm{obj}^{(t)}$.

4. If $\Delta \underline{\alpha}$ improves the incumbent solution with probability $e^{(\mathrm{obj}^{(t)} - \mathrm{obj}^{(t-1)})/q}$ (where q is an algorithm parameter), set $\underline{\tilde{\alpha}} = \underline{\alpha}^{(t)}$.

5. If $\mathrm{obj}^{(t)}$ is better than the incumbent solution, set $\underline{\hat{\alpha}} = \underline{\alpha}^{(t)}$.

6. Reduce q after a sufficient number of iterations.

7. Repeat for $t \leq t_{max}$.

The maximum weight of any move in $\Omega$ may be restricted, e.g., to five. The initial solution is set to the rounding solution, i.e., $\underline{\alpha}^{(0)} = \lfloor \underline{f} + 0.5 \rfloor - \lfloor \underline{f} \rfloor$.

In one embodiment, the simulated annealing technique may be slightly modified such that once a new optimum is found in step (5), all neighboring solutions within a Hamming distance of one are investigated before arbitrarily selecting from the moving list.

Although the above description is largely directed to a DFT filter bank, the principles of the invention readily apply to other types of oversampled filter banks. The condition matrix has a different structure but the redundancy resulting from oversampling can exploited without departing from the scope of the invention.

Figure 8:
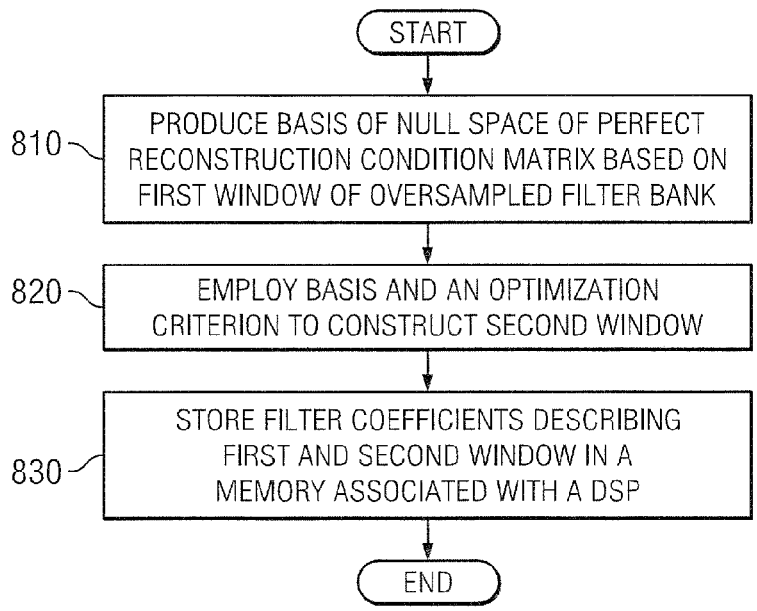
FIG. 8 illustrates a flow diagram of one embodiment of a method of optimizing the operation of an oversampled filter bank carried out according to the principles of the invention.

FIG. 8 illustrates a flow diagram of one embodiment of a method of optimizing the operation of an oversampled filter bank carried out according to the principles of the invention. The method begins in a start step. In a step 810, a null space of a perfect reconstruction condition matrix is produced based on a first window of the oversampled filter bank. In a step 820, the null space and an optimization criterion are employed to construct a second window of the oversampled filter bank. In a step 830, filter coefficients that describe the first and second window are stored in a memory associated with a DSP. The filter coefficients are then available to be employed in a filter bank associated with the DSP. The method ends in an end step.

Figure 9:
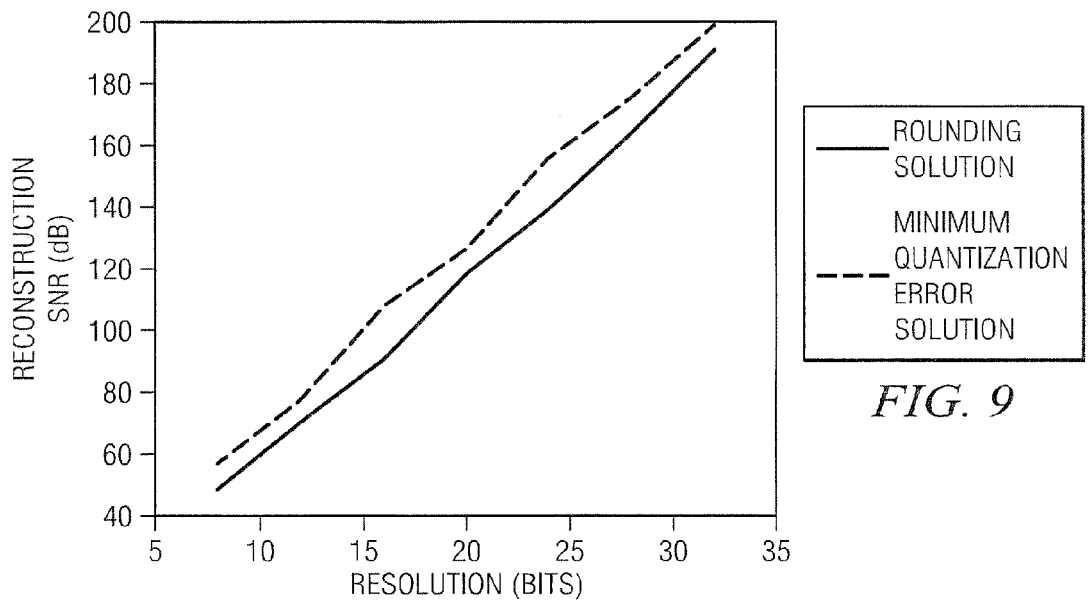
FIG. 9 illustrates a graph of reconstruction signal-to-noise ratio (SNR) for rounding and minimum quantization error solutions.

FIG. 9 illustrates the performance of a disclosed embodiment of the invention versus a rounding solution (which is conventionally used for fixed-point systems). The test data is arbitrary signals with unity variance. The number of iterations ($t_{max}$) equals $10^5$, and $L_f=96$. FIG. 9 indicates up to an 18 dB improvement without the need to increase resolution. This is equivalent to adding three bits of resolution to the DFT filter bank.

Figure 10:
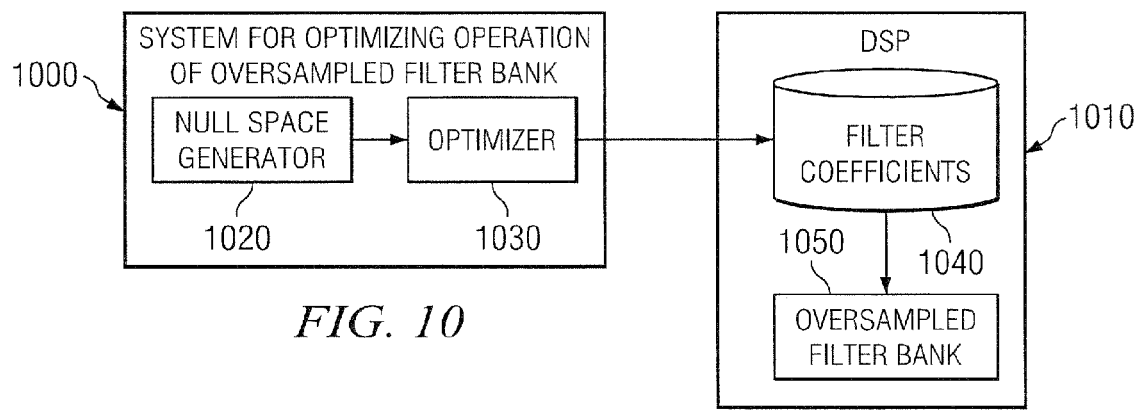
FIG. 10 illustrates a block diagram of one embodiment of a system for optimizing the operation of an oversampled filter bank implemented in a digital signal processor (DSP) and constructed according to the principles of the invention.

FIG. 10 illustrates a block diagram of one embodiment of a system, generally designated 1000, for optimizing the operation of an oversampled filter bank implemented in a DSP, generally designated 1010, and constructed according to the principles of the invention. The oversampled filter bank includes a plurality of lowpass filters (not shown in FIG. 10, but shown in FIG. 1) configured to process an input signal to yield an output signal based in part on coefficients that describe a first window and in part on coefficients that describe a second window. The first window may be an analysis window, and the second window may be a synthesis window.

A null space generator 1020 within the system 1000 is configured to produce the basis of the null space of a perfect reconstruction condition matrix based on the first window. An optimizer 1030 is associated with the null space generator 1020. The optimizer 1030 is configured to employ the basis and an optimization criterion to construct the second window. The result of this process is a plurality of filter coefficients that are caused to be stored in a memory 1040 associated with the DSP 1010. The filter coefficients are then made available from the memory 1040 to an oversampled filter bank 1050 during operation of the DSP 1010.

Although the invention has been described in detail, those skilled in the pertinent art should understand that they can make various changes, substitutions and alterations herein without departing from the spirit and scope of the invention in its broadest form.

What is claimed is:

1. A system for optimizing an operation of an oversampled filter bank, comprising:
    a null space generator configured to produce a basis of a null space of a perfect reconstruction condition matrix based on a first window of said oversampled filter bank; and
    an optimizer associated with said null space generator and configured to employ said basis and an optimization criterion to construct a second window of said oversampled filter bank.

2. The system as recited in claim 1 wherein said oversampled filter bank is an oversampled discrete Fourier transform filter bank.

3. The system as recited in claim 1 wherein said oversampled filter bank comprises lowpass filters.

4. The system as recited in claim 1 wherein said first window is an analysis window and said second window is a synthesis window.

5. The system as recited in claim 1 wherein said optimization criterion is selected from the group consisting of:
    a least-order design criterion,
    a minimum-norm design criterion,
    a minimum out-of-band energy design criterion,
    a least-square design criterion, and
    a minimum quantization-error design criterion.

6. The system as recited in claim 1 wherein said optimizer employs a simulated annealing technique to construct said second window.

7. The system as recited in claim 1 wherein said second window $\underline{f}$ has a general formula $$\underline{f} = \underline{f}^{\#} + \sum_{i=1}^{K} c_i \cdot \underline{v}_i$$

and said optimizer applies said optimization criterion to $\{\underline{c}_i\}_{i=1:K}$.

8. A method of optimizing an operation of an oversampled filter bank, comprising:
    producing a basis of a null space of a perfect reconstruction condition matrix based on a first window of said oversampled filter bank; and
    employing said basis and an optimization criterion to construct a second window of said oversampled filter bank.

9. The method as recited in claim 8 wherein said oversampled filter bank is an oversampled discrete Fourier transform filter bank.

10. The method as recited in claim 8 wherein said oversampled filter bank comprises lowpass filters.

11. The method as recited in claim 8 wherein said first window is an analysis window and said second window is a synthesis window.

12. The method as recited in claim 8 wherein said optimization criterion is selected from the group consisting of:
    a least-order design criterion,
    a minimum-norm design criterion,
    a minimum out-of-band energy design criterion,
    a least-square design criterion, and
    a minimum quantization-error design criterion.

13. The method as recited in claim 8 wherein said employing comprises employing a simulated annealing technique to construct said second window.

14. The method as recited in claim 8 wherein said second window $\underline{f}$ has a general formula $$\underline{f} = \underline{f}^{\#} + \sum_{i=1}^{K} c_i \cdot \underline{v}_i$$

and said employing comprises applying said optimization criterion to $\{\underline{c}_i\}_{i=1:K}$.

15. An oversampled discrete Fourier transform (DFT) filter bank, comprising:
    a plurality of lowpass filters configured to process an input signal to yield an output signal based in part on coefficients that describe a second window designed by:
        producing a basis of a null space of a perfect reconstruction condition matrix based on a first window of said oversampled filter bank, and
        employing said basis and an optimization criterion to construct said second window.

16. The DFT filter bank as recited in claim 15 wherein said first window is an analysis window and said second window is a synthesis window.

17. The DFT filter bank as recited in claim 15 wherein said optimization criterion is selected from the group consisting of:
    a least-order design criterion,
    a minimum-norm design criterion,
    a minimum out-of-band energy design criterion,
    a least-square design criterion, and
    a minimum quantization-error design criterion.

18. The DFT filter bank as recited in claim 15 wherein said optimizer employs a simulated annealing technique to construct said second window.

19. The DFT filter bank as recited in claim 15 wherein said second window $\underline{f}$ has a general formula $$\underline{f} = \underline{f}^{\#} + \sum_{i=1}^{K} c_i \cdot \underline{v}_i$$

and said optimizer applies said optimization criterion to $\{\underline{c}_i\}_{i=1:K}$.

20. The DFT filter bank as recited in claim 15 wherein said DFT filter bank is implemented in a digital signal processor.

* * * * *